United States Patent [19]

Iida et al.

[11] Patent Number: 5,112,775
[45] Date of Patent: May 12, 1992

[54] METHOD OF MAKING DIAMOND N-TYPE SEMICONDUCTOR DIAMOND P-N JUNCTION DIODE USING DIPHOSPHORUS PENTOXIDE AND HOT FILAMENT CVD METHOD

[75] Inventors: Masamori Iida, Tokyo; Tateki Kurosu, Isehara; Ken Okano, Tokyo, all of Japan

[73] Assignee: The Tokai University Juridical Foundation, Japan

[21] Appl. No.: 609,792

[22] Filed: Nov. 7, 1990

[30] Foreign Application Priority Data

Nov. 22, 1989 [JP] Japan .................. 1-302209

[51] Int. Cl.⁵ ............... H01L 21/00; H01L 21/02; H01L 21/205; H01L 29/72
[52] U.S. Cl. ..................... 437/225; 437/228; 437/233; 437/904; 437/967; 427/69; 427/70; 427/248.1; 427/255.1; 148/DIG. 122; 252/182.12; 252/183.13; 252/502; 252/950; 252/951
[58] Field of Search ............... 437/225, 228, 233, 234, 437/904, 967; 427/69, 70, 99, 248.1, 249, 255.1, 255.2, 294; 118/715, 733; 148/122; 252/182.12, 182.13, 182.14, 183.13, 500, 510, 950, 951, 502

[56] References Cited

U.S. PATENT DOCUMENTS

| | | | |
|---|---|---|---|
| 3,852,086 | 12/1974 | Murata et al. | 252/950 |
| 4,394,400 | 7/1983 | Green et al. | 427/38 |
| 4,740,263 | 4/1988 | Imai et al. | 427/42 |
| 4,791,005 | 12/1988 | Becker et al. | 437/236 |
| 4,844,785 | 7/1989 | Kitabatake et al. | 204/192.11 |
| 4,925,701 | 5/1990 | Jansen et al. | 427/255.1 |
| 4,951,101 | 8/1990 | Alter et al. | 357/23.4 |
| 4,981,818 | 1/1991 | Anthony et al. | 437/233 |
| 5,001,452 | 3/1991 | Imai et al. | 264/349 |
| 5,008,737 | 4/1991 | Burnham et al. | 428/614 |
| 5,024,867 | 6/1991 | Iwabuchi | 437/160 |

FOREIGN PATENT DOCUMENTS 0213126 12/1984 Japan.
0232902 9/1987 Japan.
0096094 of 1989 Japan.
0066822 4/1989 Japan.

OTHER PUBLICATIONS

Kawarada, M., Diamond Film, CA114(12):112356z, 1990.
Okano, Ken, Fabricaiton of a diamond p-n junction diode using the chemical vapor technique, Solid State Electronics, 34(2), pp. 139-141, 1991.
Iida, M., Fabrication of diamond p-n junction diode by hot filament CVD Method, Katai Butsusi, 25(8), pp. 503-510, 1990.
Haku, H., Manufacture of diamond thin film by plasma chemical vapor deposition, CA111(16):144564v, 1989.
Kobayashi, K., Deposition of hard carbon films by the r.f. glow discharge Method, Thin Solid Films, 158(2), pp. 233-238, 1988.
Has, Z., RF-plasma deposition of thin diamond-like carbon film, Proc. Int. Ion Eng. Congr., vol. 2, pp. 1143-1148, 1983.
Okano, K., Synthesis of n-type semiconducting diamond film using diphosphorus pentoxide as the doping source, Appl. Phys. A, A51(4), pp. 344-346, 1990.
Kurihara, K., Diamond-film synthesis using DC plasma jet CVD, Fujitsu Sci. Tech. J. (Japan), vol. 25, no. 1, pp. 44-51, 1989.

Primary Examiner—Brian E. Hearn
Assistant Examiner—B. Everhart
Attorney, Agent, or Firm—Sixbey, Friedman, Leedom & Ferguson

[57] ABSTRACT

A diamond n-type semiconductor including a substrate and a phosphorus element-doped diamond thin film disposed on the substrate. The diamond thin film is deposited by vaporizing a solution comprising a liquid organic compound as the diamond material with diphosphorus pentoxide ($P_2O_5$) dissolved therein, and subjecting the resultant gas to a hot filament CVD method.

3 Claims, 4 Drawing Sheets

METHOD OF MAKING DIAMOND N-TYPE SEMICONDUCTOR DIAMOND P-N JUNCTION DIODE USING DIPHOSPHORUS PENTOXIDE AND HOT FILAMENT CVD METHOD

FIELD OF THE INVENTION AND RELATED ART

The present invention relates to a safe process for producing a diamond n-type semiconductor and a diamond p-n junction diode without using poisonous gas.

With respect to the synthesis of the p-type diamond, our research group has proposed a method for synthesizing a diamond p-type semiconductor wherein boric acid ($B_2O_3$) is selected as the compound containing an impurity element, and dissolved in methanol ($CH_3OH$) and diluted with acetone ($CH_3COCH_3$) the resultant solution is used for the hot filament CVD method (Japanese Laid-Open Patent Application No. 96094/1989). The specification of the above-mentioned Japanese Patent Application also discloses the synthesis of the n-type diamond. More specifically, the above-mentioned Patent Application discloses a method for synthesizing the diamond n-type semiconductor wherein phosphoric acid ($H_3PO_4$) is selected as the compound containing an impurity element, and diluted with diethyl ether ($C_2H_5OC_2H_5$), and the resultant solution is used for the hot filament CVD method.

The above-mentioned method for synthesizing p-type diamond may reproducibly provide a diamond p-type semiconductor. However, the above-mentioned method for synthesizing n-type diamond cannot reproducibly provide a diamond n-type semiconductor. Accordingly, there has been desired a method for reproducibly producing a diamond n-type semiconductor.

Particularly, in order to produce the electron device from diamond, it is necessary to synthesize both p-type diamond and n-type diamond. With respect to p-type diamond, a technique of reproducibly synthesizing the same has already been established as described above, and there is no problem in the conversion of the p-type diamond to the desired device.

However, the above-mentioned method for synthesizing a diamond n-type semiconductor providing an insufficient yield, and the probability of producing the product showing a rectification characteristic is only one to two per total ten products produced thereby.

Accordingly, the low yield has been the most difficult pending problem in an conversion of diamond to the electron device.

SUMMARY OF THE INVENTION

An object of the present invention is, in view of the above-mentioned problems encountered in the prior art, to provide a process for producing a diamond n-type semiconductor while attaining a good yield, and a process for producing a diamond p-n junction diode while attaining good production efficiency.

Another object of the present invention is to provide a diamond n-type semiconductor and a diamond p-n junction diode by using the above-mentioned processes.

According to a first aspect of the present invention, there is provided a diamond n-type semiconductor comprising a substrate and a phosphorus element-doped diamond thin film deposited on the substrate, which has been formed by vaporizing a solution comprising a liquid organic compound as a diamond material and diphosphorus pentoxide ($P_2O_5$) dissolved therein, and subjecting the resultant gas to the hot filament CVD method.

According to a second aspect of the present invention, there is provided a diamond p-n junction diode, comprising a substrate, a first diamond thin film doped with a phosphorus element deposited on the substrate, and a second diamond thin film doped with a boron element deposited on the first diamond thin film, wherein the first diamond thin film has been formed by vaporizing the solution comprising a liquid organic compound as the diamond material and diphosphorus pentoxide ($P_2O_5$) dissolved therein, and subjecting the resultant gas to the hot filament CVD method; the second diamond thin film having been formed by vaporizing a solution comprising the liquid organic compound as the diamond material and a doping source for a p-type semiconductor dissolved therein, and subjecting the resultant gas to the hot filament CVD method.

According to a third aspect of the present invention, there is provided a process for producing a diamond n-type semiconductor, comprising the steps of:

selecting diphosphorus pentoxide ($P_2O_5$) as a compound containing an impurity element;

dissolving the diphosphorus pentoxide in the liquid organic compound as the diamond material, thereby to prepare a solution, and vaporizing the solution to be subjected to the hot filament CVD method, thereby to form a diamond thin film doped with a phosphorus element on the substrate.

According to a third aspect of the present invention, there is provided a process for producing a diamond p-n junction diode, comprising the steps of:

forming the diamond n-type semiconductor on the substrate by a process comprising the steps of: selecting diphosphorus pentoxide as a compound containing an impurity element, dissolving the diphosphorus pentoxide in a liquid organic compound as a diamond material, thereby to prepare a solution, and vaporizing the solution to be subjected to a hot filament CVD method to form a diamond thin film doped with a phosphorus element on a substrate;

selecting a doping source for p-type semiconductor formation as the compound containing the impurity element;

dissolving the doping source in the liquid organic compound as the diamond material, thereby to prepare the solution; and vaporizing the solution to be subjected to the hot filament CVD method, to form a diamond p-type semiconductor doped with a boron element on the diamond n-type semiconductor, whereby the integrated p-n junction is formed.

These and other objects, features and advantages of the present invention will become more apparent upon a consideration of the following description of the preferred embodiments of the present invention taken in conjunction with the accompanying drawings.

DETAILED DESCRIPTION OF THE INVENTION

Specific examples of a suitable liquid organic compound may include: hydrocarbons such as methane, ethane, propane, butane, acetylene, ethylene, propylene, butadiene and benzene; methanol, ethanol, acetone, acetaldehyde, etc.

Further, as the compound (i.e. doping agent or doping source) containing an impurity element for forming a p-type semiconductor, there may be used an element of group Vb or a compound containing such an element. Specific examples thereof may include elements such as N, P, As, Bi and Sb; compounds such as $NH_3$, $N_2H_4$, $PH_3$, $P_2O_5$, $AsH_3$, $CH_3AsH_2$, $CH_3AsBr_2$, $(CH_3)_3As$, $(CH_3)_3Bi$, $(C_2H_5)_3Bi$, $SbH_3$, $ClCH_2SbCl_2$, $CH_3SbH_2$ and $(CF_3)_3Sb$.

According to our investigation, it has been found that when diphosphorus pentoxide ($P_2O_5$) is selected as the impurity element-containing compound to be mixed, the reproducibility in the production of the diamond n-type semiconductor is remarkably improved, as compared with that obtained in a case where phosphoric acid ($H_3PO_4$) is selected. The reason for this may be that $P_2O_5$ is dissolved in an organic compound such as methanol ($CH_3OH$) more easily than is $H_3PO_4$. Further, it is considered that when $P_2O_5$ is used, a compound comprising phosphorus (P) and methyl group ($CH_3$) is formed in the solution, and the $CH_3$ aids the synthesis of diamond per se, and P is incorporated in the diamond as the donor impurity.

When the process according to the above-mentioned fourth aspect of the present invention is used, a diamond thin film having a characteristic of then n-type semiconductor doped with the phosphorus element is deposited on the substrate by the CVD method, and a diamond thin film having the characteristic of a p-type semiconductor doped with the boron element is then deposited on the above-mentioned film, whereby the diamond p-n junction diode may easily be produced so as to provide a good yield. Further, since the diphosphorus pentoxide ($P_2O_5$) used in the present invention has no toxicity like phosphine ($PH_3$), the cost of production apparatus may be reduced in view of safety.

Next, a preferred embodiment of the present invention will be described.

Figure 1:
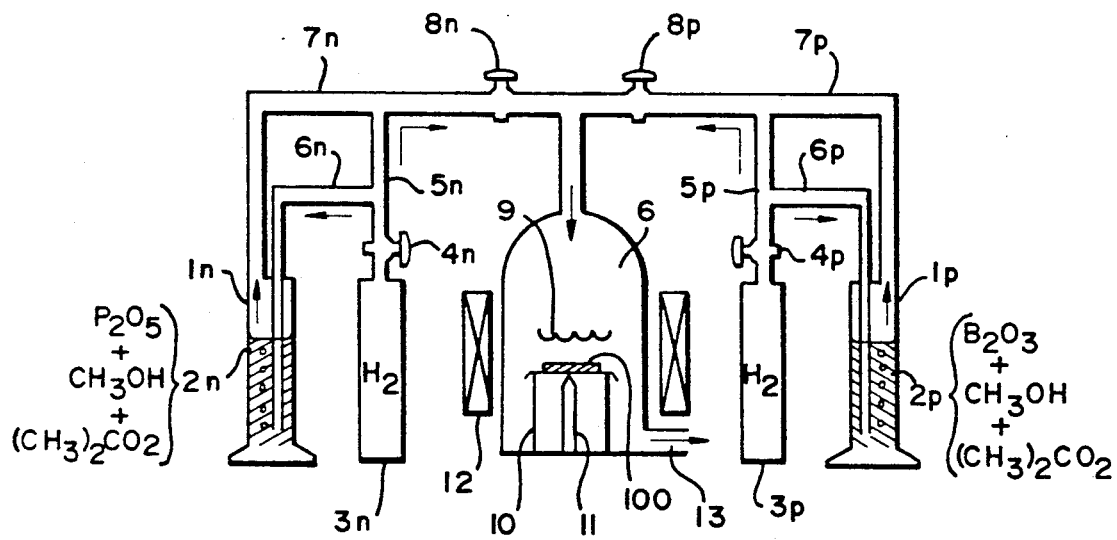
FIG. 1 is a schematic view showing an embodiment of the apparatus for practicing the process according to the present invention.

FIG. 1 shows an embodiment of the apparatus for practicing the process according to the present invention.

Referring to FIG. 1, the CVD reaction chamber 6 is disposed in the central portion of the apparatus show in this figure, containers (or vessels) 1n and 1p for containing a reactant (or material) are symmetrically disposed on both sides thereof, and these three members are connected with each other by gas introduction conduits 7n and 7p. On the other hand, carrier gas feeders 3n and 3p are respectively disposed in combination with the symmetrically disposed containers 1n and 1p for containing the reactant, and pipes 5n, 5p, 6n, and 6p for supplying a carrier gas to the gas introduction conduits 7n, and 7p are disposed.

Further, cocks 8n and 8p are respectively disposed in the gas introduction conduits 7n and 7p, and cocks 4n and 4p are respectively disposed in the pipes 5n and 5p.

Accordingly, when the cock 8p is turned off and the cock 8n is turned on, the CVD reaction chamber 6, the reactant-containing vessel 1n and the carrier gas feeder 3n, disposed on the left side of the reaction chamber 6 are connected with each other. On the other hand when the cook 8n is turned off and the cook 8p is turned on, the CVD reaction chamber 6, the reactant-containing vessel 1p and the carrier gas feeder 3p chamber 6 are connected with each other. As described hereinafter, when the apparatus shown in FIG. 1 is used, the CVD reaction chamber is connected with the reactant-containing vessel and carrier gas feeder disposed on either one side of the reaction chamber, as desired.

The apparatus as described above is the hot filament CVD apparatus and has the structure wherein a reactant or material for diamond contained in the reactant-containing vessel 1n (1P) is introduced into the CVD reaction chamber 6, and the reactant gas is subjected to pyrolysis so that diamond may be synthesized.

In the reactant-containing vessel 1n (or 1p), a diamond material solution 2n (or 2p) containing the compound containing the impurity element capable of being the donor or accepter dissolved therein is contained, and the gas introduction conduit 5n (or 5p) extends from the vessel 1n (or 1p) to the reaction chamber 6. The reference numeral 3n (or 3p) denotes the carrier gas feeder from which the gas feed pipe 5n (or 5p) extends. The gas feed pipe 5n (or 5p) is connected to the gas introduction conduit 7n (or 7p), and the gas introduction conduit 5n (or 5p) branches out into another gas introduction conduit 6n (or 6p) in the course thereof. The gas introduction conduit 6n (or 6p) extends near to the bottom of the material-containing vessel 1n. Hydrogen may generally be used as the carrier gas. The hydrogen bubbles in the reactant solution 2n (or 2p) to vaporize it, and introduces the resultant reactant gas into the reaction chamber 6.

In the reaction chamber 6, the filament 9 comprising tungsten is disposed and a holder 10 is disposed below the filament 9. On the holder 10 there is disposed the substrate 100 on which diamond is to be deposited. The material for the substrate 100 may generally comprise silicon (Si), but can also be molybdenum (Mo), silicon carbide (SiC) or diamond. In FIG. 1, the reference numeral 11 denotes a thermocouple for measuring the temperature of the substrate 100, the reference numeral 12 denotes an electric furnace for heating the interior of the reaction chamber, and the reference numeral 13 denotes a discharge port for discharging an unreacted gas.

Next, there is described a process for synthesizing artificial diamond containing the impurity added thereto, by use of the apparatus as shown in FIG. 1.

Figures 2A, 2B:
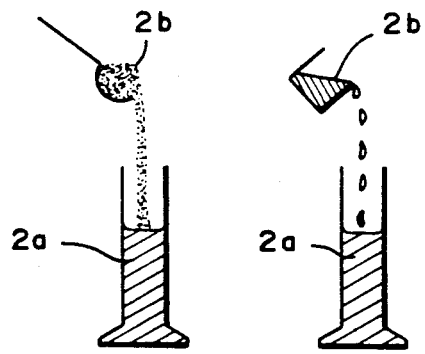
FIGS. 2A and 2B are views each illustrating a state wherein a compound containing an impurity element is dissolved in a diamond material.

First, the cock 8p is turned off and the cock 8n is turned on. Then, as shown in FIGS. 2A or 2B, the compound containing the pre-determined impurity element is dissolved in the liquid diamond material 2a to prepare the mixture 2n, which is contained in the vessel 1n. FIG. 2A shows a case wherein the compound to be dissolved comprises powder, and FIG. 2B shows a case wherein the compound to be dissolved comprises a liquid.

Thereafter, for example, a substrate 100 comprising silicon (Si) is set onto the holder 10. Then, the electric furnace 12 is operated to heat the interior of the reaction chamber 6 up to the predetermined temperature, the filament 9 is heated up to the predetermined temperature, and thereafter the cock 4n of the gas feeder 3n is turned on. Thus, a carrier gas ($H_2$) is introduced into the vessel 1n by the medium of the feed pipe 6n, and the reactant solution 2n is subjected to bubbling by use of the carrier gas ($H_2$) to be vaporized. The resultant material gas is conveyed by the carrier gas supplied from the feed pipe 5n, and introduced into the CVD reaction chamber 6 through the medium of the gas introduction conduit 7n. In the reaction chamber 6, the reactant gas mixture comprising the diamond material and the impurity compound is pyrolyzed by the tungsten filament heated up to a high temperature so that a diamond thin film containing the impurity element is deposited on the substrate 100 disposed under the filament 9. In such a pyrolysis reaction, e.g., when acetone is used as the diamond material, the following decomposition reaction may occur:

It is considered that since the thus produced methyl group ($CH_3$) is highly reactive, hydrogen atoms (H) are freed and carbon atoms are successively bonded to each other, so that impurity atoms are also involved in such bond formation to form the diamond crystal structure containing the impurity. While such diamond formation process is not necessarily clear, it is considered that the presence of the methyl group ($CH_3$) and hydrogen atom (H) is very important to the growth of the diamond. Further, with respect to the hydrogen, the CVD reaction is conducted in a hydrogen atmosphere and the hydrogen atom is a very active atom and has a high reactivity. Accordingly, the hydrogen atom has a function such that it easily decomposes the double bond capable of forming a graphite structure, and prevents the formation of structures other than the diamond crystal structure, such as graphite and amorphous carbon structures.

Incidentally, it is considered that the concentration of the impurity actually contained in the diamond to be synthesized on the basis of doping can be different from the concentration of the impurity contained in the reactant solution. However, the concentration of the impurity to be subjected to the doping can be increased or decreased in proportion to the concentration of the impurity contained in the reactant solution, whereby the resistance or resistivity of the diamond to be synthesized can be changed.

According to the above-mentioned embodiment, a diamond containing a donor or accepter can be synthesized safely and easily.

In the above-mentioned embodiment, the reactant solution 2n is vaporized by using a carrier gas and introduced into the reaction chamber. However it is also possible to heat the container 1n to vaporize the reactant solution 2n, and to introduce the resultant vapor into the reaction chamber 4 in a hydrogen atmosphere.

Further, the above-mentioned operations can also be conducted while the reactant-containing container 1p and the carrier gas feeder 3p disposed on the right side of the reaction chamber are used by turning the cock 8n off and turning the cock 8p on.

Hereinbelow, the present invention is described in more detailed with reference to experimental Examples.

EXPERIMENTAL EXAMPLE 1

In an apparatus system as shown in FIG. 1, the cock 8p was turned off and the cock 8n was turned on, whereby the reactant-containing container 1n and the carrier gas feeder 3n disposed on the left side of the reaction chamber 6 were used.

First, diphosphorus pentoxide ($P_2O_5$) was dissolved in methanol ($CH_3OH$), and the resultant solution was diluted with acetone so as to provide a volume which was several times to several thousand times the initial volume. A diamond was synthesized by using the thus obtained solution according to the hot filament CVD method.

More specifically, reaction conditions in the CVD reaction chamber were as follows:

Temperature of the filament 9: $2000° \sim 2300°$ C.
Temperature of the substrate 100: $650° \sim 900°$ C.
Gas flow rate: $50 \sim 200$ SCCM
Reaction pressure: 760 Torr In the above-mentioned synthesis, Si was used as the substrate and hydrogen ($H_2$) was used as the carrier gas. As a result, a thin film of an n-type diamond showing an n-type semiconductor characteristic was synthesized on the n-type Si substrate.

The thus obtained n-type diamond thin film was evaluated by using various evaluation methods such as X-ray diffraction, reflective high-speed electron diffraction (RHEED), and Raman spectroscopy. As a result, it was confirmed that the above-mentioned n-type diamond contained very little graphite, amorphous carbon, etc, and had a high diamond purity.

Further, it was also confirmed that the n-type diamond obtained according to the above-mentioned method showed a stable resistivity even at a high temperature, and was very advantageous in view of a semiconductor material having a low resistivity.

EXPERIMENTAL EXAMPLE 2

The n-type diamond was deposited on the n-type Si substrate in the same manner as in EXPERIMENTAL EXAMPLE 1. Thereafter, the reactant-containing container 1n and the carrier gas feeder 3n disposed on the left side of the reaction chamber were used by turning the cock 8n off and turning the cock 8p on. The p-type diamond doped with boron B hereinafter, simply referred to as "B") was deposited on the n-type diamond.

More specifically, the n-type diamond doped with P was deposited on the n-type Si substrate according to the same steps as described in EXPERIMENTAL EXAMPLE 1. Then, boric acid ($B_2O_3$) was dissolved in methanol ($CH_3OH$), and the resultant solution was diluted with acetone so as to provide a volume which was several times to several thousand times the initial volume. By use of the thus obtained solution, the p-type diamond doped with B was deposited on the layer of the n-type diamond doped with P on the basis of the CVD reaction under the same conditions as described in EXPERIMENTAL EXAMPLE 1.

In the thus obtained triple-layer sample comprising the n-type Si (100), n-type diamond (100n) and p-type diamond (100p), and as the electrodes indium In (99) hereinafter, simply referred to as "In") was welded to the n-type Si (100) and a paste comprising silver Ag (101) hereinafter, simply referred to as "Ag") was attached to the p-type diamond layer (100P). The resultant diode sample had a structure as shown in FIG. 3.

When the above-mentioned sample was evaluated by using electron diffraction, Raman spectroscopy etc. it was confirmed that the respective p-doped and B-doped layers comprised diamond containing very little of graphite, amorphous carbon, etc. When the resistivities of the respective layers were measured according to the four-point probe method, the p-doped layer (100$n$) showed a resistivity of 100 ohm cm, and the B-doped layer (100$p$) showed a resistivity of 0.1 ohm cm. Further, when the electrical conduction types of the respective p-doped and B-doped layers were evaluated by utilizing the Seebeck effect and the Hall effect, it was found that the P-doped and B-doped layers were n-type and p-type layers, respectively.

Figure 3:
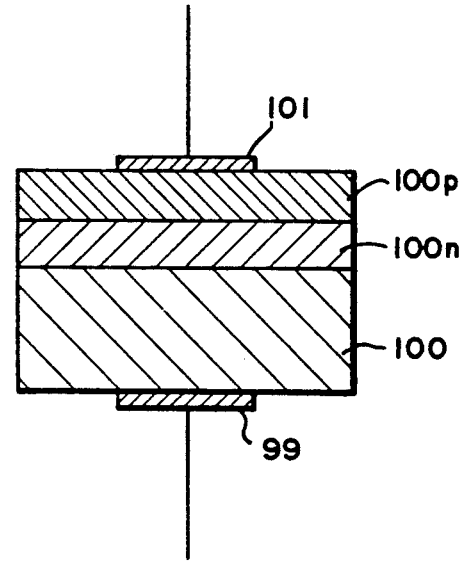
FIG. 3 is a schematic view showing the structure of a sample diode.
Figure 4A:
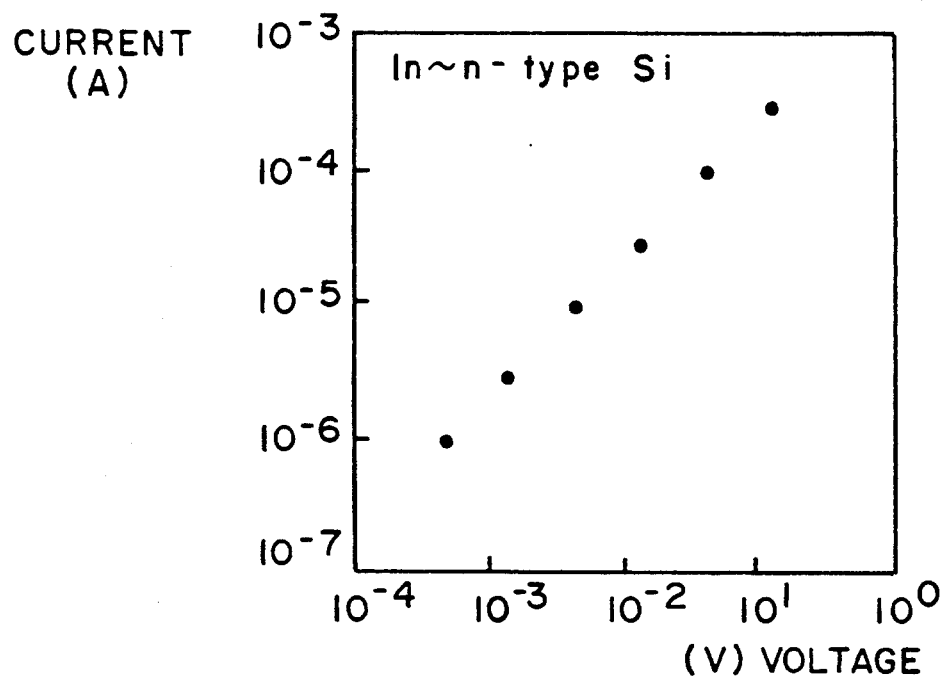
FIGS. 4A, 4B and 4C are graphs respectively showing current-voltage characteristics of three intermediate layers.
Figure 4B:
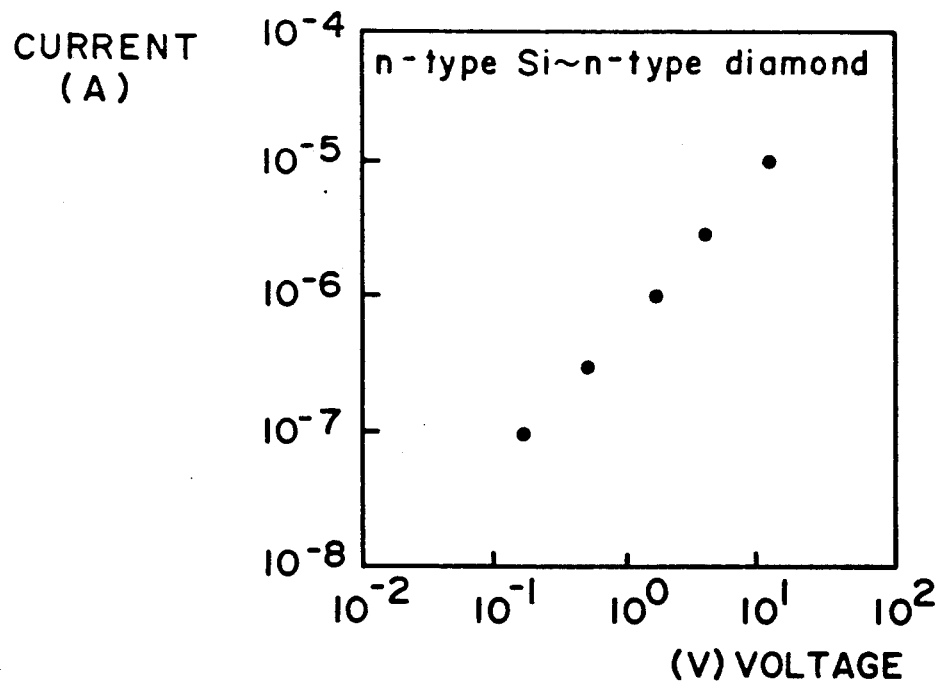
Figure 4C:
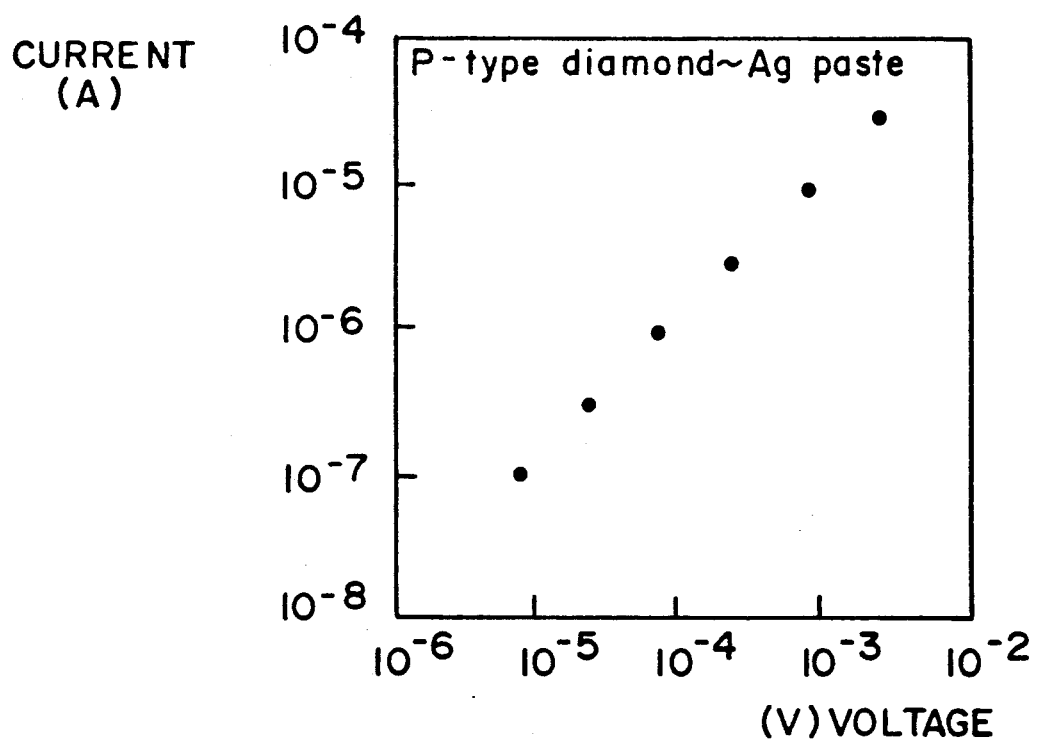

The sample as shown in FIG. 3 comprised three interfaces, i.e., In~n-type Si substrate layer, n-type Si substrate layer~n-type diamond layer, and p-type diamond layer~Ag paste, in addition to the diamond p-n junction. These respective layers had no rectification characteristic since these layers showed current-voltage characteristics as shown in FIG. 4A, 4B, and 4C.

Accordingly, the layers other than the diamond p-n junction showed ordinary resistance properties without a rectification characteristic.

Figure 5A:
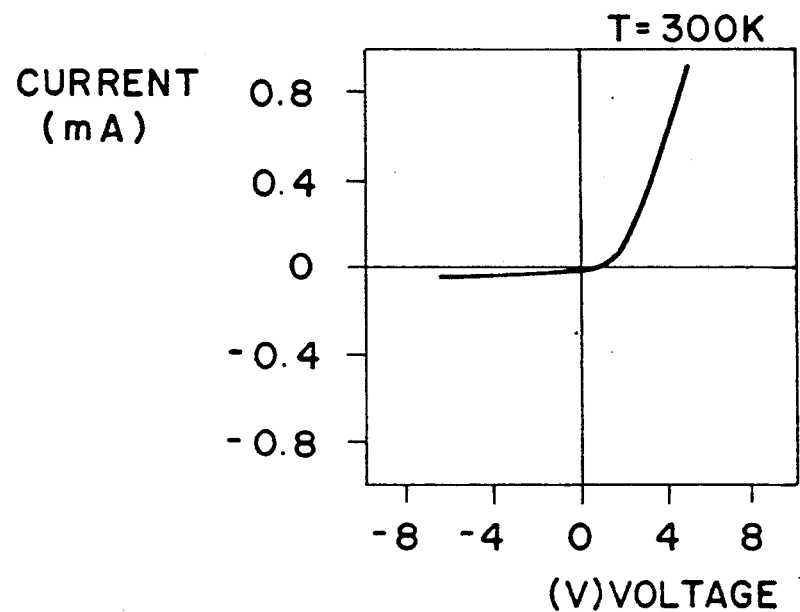
FIG. 5A is a graph showing a current-voltage characteristic of a diamond p-n junction diode at 300° K.
Figure 5B:
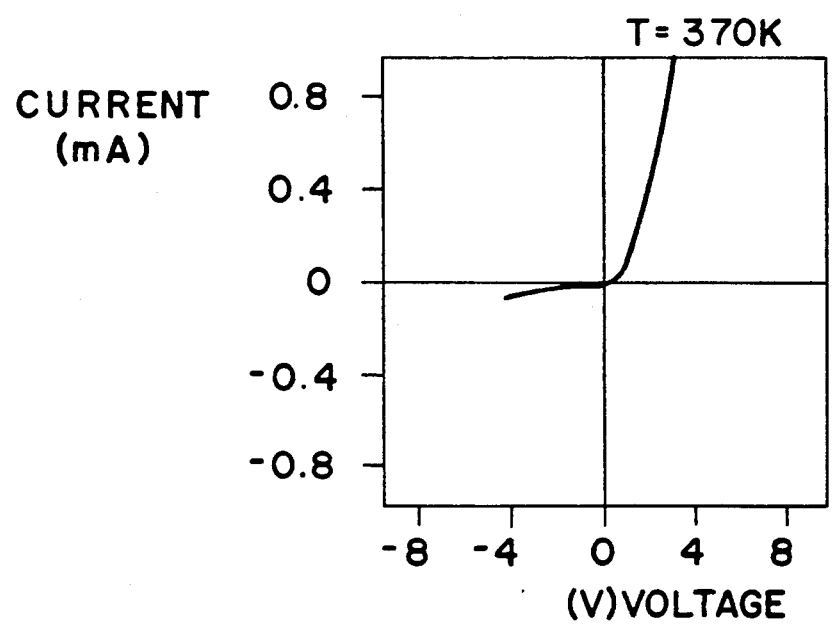
FIG. 5B is a graph showing a current-voltage characteristic of the same diode at 370° K.

FIG. 5A is a graph showing the current-voltage characteristic of the diamond p-n junction according to the present invention at 300° K., and FIG. 5B is a graph showing the current-voltage characteristic thereof at 370° K. Both of these figures indicate clear rectification characteristics and further indicate that the diamond p-n junction shows a rectification characteristic at normal temperature (300° K.) which is similar to that at a high temperature (370° K).

Particularly, the above-mentioned diamond p-type semiconductor and process for producing the p-n junction are excellent in productivity. More specifically, Japanese Laid-Open Patent Application No. 96094/1989 discloses, in its specific Examples, a method for synthesizing diamond n-type semiconductor wherein phosphoric acid ($H_3PO_4$) is diluted with diethyl ether ($C_2H_5OC_2H_5$) and the resultant solution is used for a hot filament CVD method. However, this method provides an insufficient yield, and the probability of producing a product (p-n junction diode) showing rectification characteristic is only one to two per total ten products produced thereby.

On the other hand, the above mentioned process according to the present invention provided ten products showing a rectification characteristic per total ten products produced therein.

As described hereinabove, the process for producing a diamond n-type semiconductor according to the present invention may synthesize the diamond having an n-type semiconductor characteristic safely and easily, by utilizing the hot filament CVD method. Further, this process produces a marked effect such that the resultant reproducibility is excellent.

Further, the process for producing the diamond p-n junction diode according to the present invention may provide a diamond p-n junction diode safely, easily and reproducibly.

The p-n junction diode produced according to the present invention shows a rectification characteristic not only at 300° K. but also at 370° K. Accordingly, the present invention may provides a diode which is effectively usable even in high-temperature conditions.

What is claimed is:

1. A process for producing a diamond N-type semiconductor, comprising the steps of:
    selecting diphosphorus pentoxide ($P_2O_5$) as a compound containing an impurity element;
    dissolving the diphosphorus pentoxide in a liquid organic compound as a diamond material, thereby preparing a solution, and
    vaporizing the solution and subjecting it to a hot filament CVD method, thereby forming a diamond thin film doped with a phosphorus element on a substrate.

2. A process for producing a diamond p-n junction diode, comprising the steps of:
    selecting diphosphorus pentoxide ($P_2O_5$) as a compound containing an impurity element;
    dissolving the diphosphorus pentoxide in a liquid organic compound as a diamond material, thereby preparing a solution, and
    vaporizing the solution and subjecting it to a hot filament CVD method, thereby forming a diamond thin film n-type semiconductor doped with a phosphorus element on a substrate;
    selecting a doping source for p-type semiconductor formation as a compound containing an impurity element;
    dissolving the doping source in a liquid organic compound as a diamond material, thereby to prepare a solution; and
    vaporizing the solution and subjecting it to a hot filament CVD method, to deposit diamond p-type semiconductor material doped with a boron element on the diamond n-type semiconductor whereby an integrated p-n junction is formed.

3. A process according to claim 2 wherein said doping source for the p-type semiconductor formation comprises boric acid ($B_2O_3$).

* * * * *